United States Patent [19]
Noguchi et al.

[11] Patent Number: 4,731,516

[45] Date of Patent: Mar. 15, 1988

[54] LASER POLISHING SEMICONDUCTOR WAFER

[75] Inventors: Takeshi Noguchi; Yoshihiro Hirata; Junichi Arima; Eisuke Tanaka; Reiji Tamaki; Masanori Obata, all of Itami, Japan

[73] Assignee: Mitsubishi Denki Kabushiki Kaisha, Tokyo, Japan

[21] Appl. No.: 917,124

[22] Filed: Oct. 9, 1986

[30] Foreign Application Priority Data

Oct. 11, 1985 [JP] Japan .................. 60-227191

[51] Int. Cl.$^4$ ............................. B23K 26/00
[52] U.S. Cl. .................. 219/121 LF; 156/643
[58] Field of Search .................. 125/1, 30 R; 219/121 LF; 156/643, 645

[56] References Cited

U.S. PATENT DOCUMENTS

| | | | |
|---|---|---|---|
| 4,015,100 | 3/1977 | Grannathu | 219/121 LF |
| 4,243,433 | 1/1981 | Gibbons | 219/121 LF |
| 4,343,832 | 8/1982 | Smith | 219/121 LF |
| 4,390,392 | 6/1983 | Robinson | 219/121 LF |
| 4,663,826 | 5/1987 | Baeuerle | 156/643 |

*Primary Examiner*—Harold D. Whitehead
*Attorney, Agent, or Firm*—Sughrue, Mion, Zinn, Macpeak and Seas

[57] ABSTRACT

The rough ground rear surface 13b of a semiconductor wafer 11 is mirror-polished by localized irradiation with a focused laser beam 21. The wafer is moved relative to the beam, and the melt puddle formed by the beam thereafter recrystallizes at its trailing edge 24 to leave a mirror smooth rear surface 13c.

5 Claims, 5 Drawing Figures

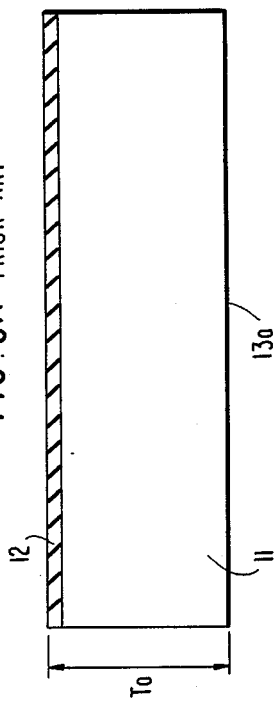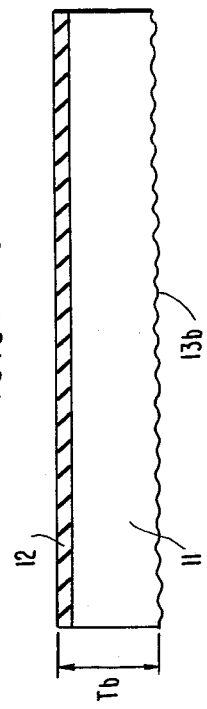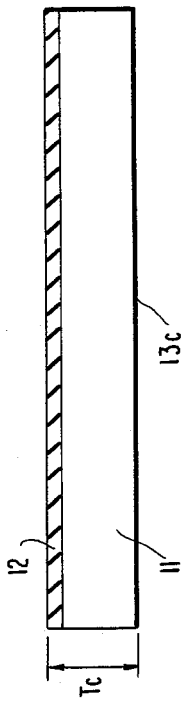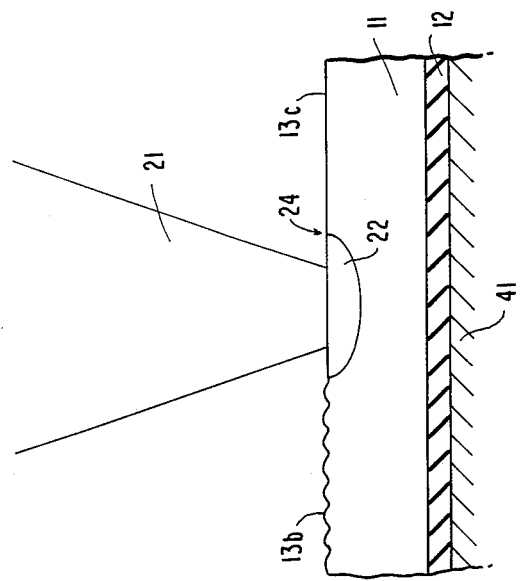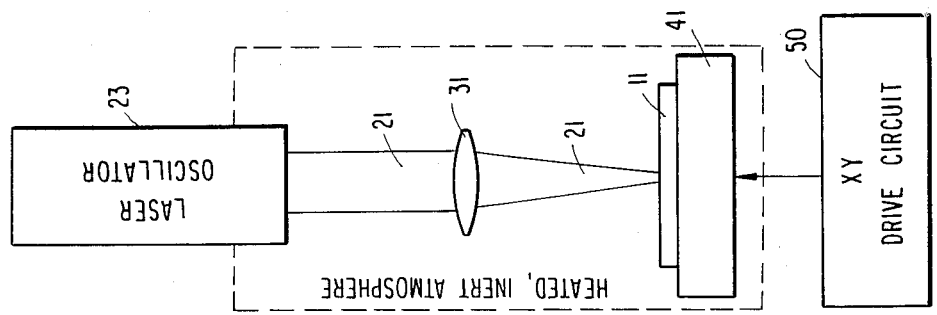

LASER POLISHING SEMICONDUCTOR WAFER

BACKGROUND OF THE INVENTION

This invention relates to a process for manufacturing semiconductor devices, and more particularly to a method of mirror-polishing the rear surface of a semiconductor wafer without damaging an electronic component formed on the front surface thereof.

A conventional process for manufacturing semiconductor devices generally comprises the steps of grinding and polishing the rear surface of a semiconductor wafer, on the front surface of which an electronic component is formed. These steps are necessary to grind the wafer down to a predetermined thickness and to thereafter polish the ground surface so that a film of metal, such as Au, can be formed thereon by vapor deposition.

FIG. 3A through FIG. 3C are schematic cross-sectional views showing the steps involved in such conventional grinding and polishing operations. Referring to FIG. 3A a semiconductor wafer 11 of initial thickness Ta has an electronic component 12, such as a transistor, formed on its front surface. The rear surface 13a of the wafer is usually ground down by a rotating grindstone apparatus to a thickness Tb as shown in FIG. 3B, which leaves an unacceptably rough or rippled rear surface 13b. A polishing step is thus performed in order to provide a smooth rear surface 13c as shown in FIG. 3C, with the final wafer thickness being further reduced to the dimension Tc.

Mechanical polishing may be implemented using a rotating disk and a pressure head, as disclosed in U.S. Pat. No. 4,141,180. A chemical polishing method has also been commonly used. These conventional methods have some disadvantages. In the mechanical method, when the rough rear surface 13b of the wafer 11 is polished, the extremely miniaturized and delicate electronic component 12 formed on the front surface of the wafer is susceptible to damage because it is pinched under pressure between the polishing disk and the pressure head. With polishing by the chemical method, on the other hand, a portion of the electronic component 12 is liable to be etched away or damaged by the caustic chemical agent used.

SUMMARY OF THE INVENTION

These disadvantages are effectively overcome in accordance with the present invention by irradiating the rear surface of the semiconductor wafer with a laser beam having an energy level larger than the band gap energy of the semiconductor wafer. The rear surface of the wafer is melted by the laser beam, and thereafter recrystallizes to leave a mirror smooth surface on which an Au film may be easily deposited.

BRIEF DESCRIPTION OF THE DRAWINGS

FIG. 1 is a schematic elevation of an embodiment of this invention;

FIG. 2 is an enlarged cross-section of a portion of FIG. 1; and

FIG. 3A through FIG. 3C are schematic cross-sectional views illustrating conventional steps of grinding and polishing.

DETAILED DESCRIPTION OF THE PREFERRED EMBODIMENT

With reference to FIGS. 1 and 2, a semiconductor wafer 11 previously rough ground as described above is disposed on an XY table 41 with its electronic components 12, such as a transistor array, in contact with the upper surface of the table. The direction and speed of movement of the table are controlled by an XY drive circuit 50 to implement the movement of the wafer 11 in the X and Y directions as required. A laser beam 21 generated by a laser oscillator 23 is focused by a lens 31 onto the roughened rear surface 13b of the wafer, which has been ground down to a predetermined thickness Tb, to locally melt the irradiated portion of such rear surface. A melt zone 22 having a smooth puddle surface is thus formed on the rear surface of the wafer. As the table 41 is continuously moved in the X and Y directions at a predetermined speed by the drive circuit 50, the melt zone 22 accordingly progresses across the wafer in opposite directions. A liquid-solid interface is thereby formed on the rear surface 13b, which recrystallizes at its trailing edge 24 upon the passage of the melt beam 21 to leave a smooth and mirror-polished surface 13c. The laser beam 21 is efficiently absorbed by the rear surface 13b when the energy level of the beam is larger than the band gap energy of the semiconductor wafer 11, without damaging the diffused transistor array.

Experimental results have established that a mirror-polished rear surface is obtained when the ground rear surface has roughness ridges of approximately 1 $\mu$m in depth and the wafer surface is heated and fused or melted by a laser beam of about 20 Watts power, 50 $\mu$m in width, and scanning or moving at about 1 cm/second. When these laser heating, localized melting parameters are implemented with the semiconductor wafer preheated to approximately 200°–400° C. in an inert atmosphere, a rear wafer surface having an extreme or mirror smoothness results.

What is claimed is:

1. In the manufacture of semiconductor devices, a method for mirror-polishing the rear surface (13b) of a semiconductor wafer (11) rough ground to a predetermined thickness (Tb) without damaging an electronic component (12) formed on the front surface of the wafer, said mirror-polishing method comprising the steps of:

(a) disposing the semiconductor wafer in an inert atmosphere, (b) preheating the semiconductor wafer to a temperature of 200°–400° C., (c) locally irradiating the rear surface of said semiconductor wafer with an energy beam (21) to form a melt puddle (22) on said surface;

(d) moving said beam with respect to said wafer to attendantly move the irradiating area and thus the melt puddle over the rear surface of said wafer, and (e) recrystallizing the melt puddle at the trailing edge (24) of a liquid-solid interface thereof to leave a smooth and mirror-polished rear wafer surface (13c), wherein (f) said semiconductor wafer is maintained preheated in said inert atmosphere during the irradiating, moving and recrystallizing steps.

2. A method according to claim 1, wherein said beam is a laser beam.

3. A method according to claim 2, wherein said laser beam has an energy level larger than the band gap energy of said semiconductor wafer.

4. A method according to claim 2, wherein the laser beam has a power of 20 Watts and is 50 $\mu$m in width at a point of impingement thereof on the rear surface of the wafer and the relative speed of movement between the beam and the wafer is 1 cm/second.

5. A method according to claim 4, wherein the wafer is disposed on a table (41) with its front surface in planar contact therewith, and the table is moved in the X and Y directions under the control of a drive circuit (50).

* * * * *